United States Patent
Gribok et al.

(10) Patent No.: US 7,913,149 B2
(45) Date of Patent: Mar. 22, 2011

(54) LOW COMPLEXITY LDPC ENCODING ALGORITHM

(75) Inventors: Sergey Gribok, Santa Clara, CA (US);
Alexander Andreev, San Jose, CA (US);
Igor Vikhliantsev, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 1050 days.

(21) Appl. No.: 11/613,256

(22) Filed: Dec. 20, 2006

(65) Prior Publication Data

US 2008/0168334 A1    Jul. 10, 2008

(51) Int. Cl.
*H03M 13/00* (2006.01)

(52) U.S. Cl. .................................. 714/781; 714/755

(58) Field of Classification Search .................. 714/781, 714/755
See application file for complete search history.

(56) References Cited

U.S. PATENT DOCUMENTS

| | | | |
|---|---|---|---|
| 6,633,856 B2 * | 10/2003 | Richardson et al. | 706/15 |
| 6,757,122 B1 * | 6/2004 | Kuznetsov et al. | 360/53 |
| 6,785,863 B2 * | 8/2004 | Blankenship et al. | 714/799 |
| 6,957,375 B2 * | 10/2005 | Richardson | 714/752 |
| 6,961,888 B2 * | 11/2005 | Jin et al. | 714/752 |
| 7,000,168 B2 * | 2/2006 | Kurtas et al. | 714/755 |
| 7,072,417 B1 * | 7/2006 | Burd et al. | 375/295 |
| 7,120,856 B2 * | 10/2006 | Zhang et al. | 714/801 |
| 7,162,684 B2 * | 1/2007 | Hocevar | 714/800 |
| 7,171,603 B2 * | 1/2007 | Classon et al. | 714/752 |
| 7,178,082 B2 * | 2/2007 | Yu et al. | 714/752 |
| 7,178,085 B2 * | 2/2007 | Chae et al. | 714/758 |
| 7,237,171 B2 * | 6/2007 | Richardson | 714/752 |
| 7,243,286 B2 * | 7/2007 | Kim et al. | 714/752 |
| 7,260,763 B2 * | 8/2007 | Sukhobok et al. | 714/758 |
| 7,278,082 B2 * | 10/2007 | Kim et al. | 714/752 |

(Continued)

FOREIGN PATENT DOCUMENTS

WO    WO 2006/031092    3/2006

OTHER PUBLICATIONS

Tong Zhang; Parhi, K.K.; , "A class of efficient-encoding generalized low-density parity-check codes," Proceedings IEEE International Conference on Acoustics, Speech, and Signal Processing, May 11, 2001, vol. 4, pp. 2477-2480,URL:http://ieeexplore.ieee.org/stamp/stamp.jsp?tp=&arnumber=940503&isnumber=20357.*

(Continued)

Primary Examiner — Joseph D Torres
(74) Attorney, Agent, or Firm — Luedeka, Neely & Graham, P.C.

(57) ABSTRACT

A method of encoding a binary source message u, by calculating x:=Au, calculating y:=B'x, resolving the equation Dp=y for p, and incorporating u and p to produce an encoded binary message v, where A is a matrix formed only of permutation sub matrices, B' is a matrix formed only of circulant permutation sub matrices, and D is a matrix of the form $$D = \begin{pmatrix} T & 0 & \dots & 0 & 0 \\ 0 & T & \dots & 0 & 0 \\ \dots & \dots & \dots & \dots & \dots \\ 0 & 0 & \dots & T & 0 \\ I & I & \dots & I & I \end{pmatrix}$$

where T is a two-diagonal, circulant sub matrix, and I is an identity sub matrix.

3 Claims, 4 Drawing Sheets

U.S. PATENT DOCUMENTS

| | | | |
|---|---|---|---|
| 7,302,629 B2 * | 11/2007 | Kyung et al. | 714/752 |
| 7,313,752 B2 * | 12/2007 | Kyung et al. | 714/801 |
| 7,343,548 B2 * | 3/2008 | Blankenship et al. | 714/800 |
| 7,353,444 B2 * | 4/2008 | Owsley et al. | 714/752 |
| 7,395,494 B2 * | 7/2008 | Lee et al. | 714/801 |
| 7,451,374 B2 * | 11/2008 | Kim et al. | 714/748 |
| 7,480,845 B2 * | 1/2009 | Kim et al. | 714/752 |
| 7,493,547 B2 * | 2/2009 | Kim et al. | 714/758 |
| 7,502,987 B2 * | 3/2009 | Kyung et al. | 714/781 |
| 7,506,238 B2 * | 3/2009 | Hocevar | 714/781 |
| 7,516,390 B2 * | 4/2009 | Shen et al. | 714/755 |
| 7,516,391 B2 * | 4/2009 | Kyung et al. | 714/758 |
| 7,523,375 B2 * | 4/2009 | Spencer | 714/752 |
| 7,526,717 B2 * | 4/2009 | Kyung et al. | 714/800 |
| 7,536,623 B2 * | 5/2009 | Kim et al. | 714/752 |
| 7,581,157 B2 * | 8/2009 | Oh et al. | 714/781 |
| 7,600,173 B2 * | 10/2009 | Matsumoto | 714/755 |
| 7,600,174 B2 * | 10/2009 | Kyung et al. | 714/758 |
| 7,617,439 B2 * | 11/2009 | Shen et al. | 714/784 |
| 7,617,441 B2 * | 11/2009 | Lee et al. | 714/800 |
| 7,657,816 B2 * | 2/2010 | Cohen et al. | 714/752 |
| 2006/0053359 A1 | 3/2006 | Chae et al. | |

OTHER PUBLICATIONS

R.G. Gallager, "Low density parity check codes," IRE Trans. Inform. Theory, vol. IT-8, pp. 21-28, Jan. 1962.

D.J.C. MacKay and R.M. Neal, "Near Shannon limit performance of low density parity check codes," Electron. Lett., vol. 32, No. 18, pp. 1645-1646, 1996.

* cited by examiner $$H=$$

$$\begin{bmatrix}
00100000 & 00000001 & 00001000 & 00000100 & 01000000 & 10000000 & 00000010 \\
00010000 & 10000000 & 00000100 & 00000010 & 00100000 & 01000000 & 00000001 \\
00001000 & 01000000 & 00000010 & 00000001 & 00010000 & 00100000 & 10000000 \\
00000100 & 00100000 & 00000001 & 10000000 & 00001000 & 00010000 & 01000000 \\
00000010 & 00010000 & 10000000 & 01000000 & 00000100 & 00001000 & 00100000 \\
00000001 & 00001000 & 01000000 & 00100000 & 00000010 & 00000100 & 00010000 \\
10000000 & 00000100 & 00100000 & 00010000 & 00000001 & 00000010 & 00001000 \\
01000000 & 00000010 & 00010000 & 00001000 & 10000000 & 00000001 & 00000100 \\
 & & & & & & \\
10000000 & 00100000 & 01000000 & 00000100 & 00010000 & 00001000 & 00000001 \\
01000000 & 00010000 & 00100000 & 00000010 & 00001000 & 00000100 & 10000000 \\
00100000 & 00001000 & 00010000 & 00000001 & 00000100 & 00000010 & 01000000 \\
00010000 & 00000100 & 00001000 & 10000000 & 00000010 & 00000001 & 00100000 \\
00001000 & 00000010 & 00000100 & 01000000 & 00000001 & 10000000 & 00010000 \\
00000100 & 00000001 & 00000010 & 00100000 & 10000000 & 01000000 & 00001000 \\
00000010 & 10000000 & 00000001 & 00010000 & 01000000 & 00100000 & 00000100 \\
00000001 & 01000000 & 10000000 & 00001000 & 00100000 & 00010000 & 00000010 \\
 & & & & & & \\
10000000 & 10000000 & 10000000 & 10000000 & 10000000 & 10000000 & 10000000 \\
01000000 & 01000000 & 01000000 & 01000000 & 01000000 & 01000000 & 01000000 \\
00100000 & 00100000 & 00100000 & 00100000 & 00100000 & 00100000 & 00100000 \\
00010000 & 00010000 & 00010000 & 00010000 & 00010000 & 00010000 & 00010000 \\
00001000 & 00001000 & 00001000 & 00001000 & 00001000 & 00001000 & 00001000 \\
00000100 & 00000100 & 00000100 & 00000100 & 00000100 & 00000100 & 00000100 \\
00000010 & 00000010 & 00000010 & 00000010 & 00000010 & 00000010 & 00000010 \\
00000001 & 00000001 & 00000001 & 00000001 & 00000001 & 00000001 & 00000001 \\
\end{bmatrix}$$

$\underbrace{\hspace{3cm}}_{A} \underbrace{\hspace{2cm}}_{B}$

Fig. 2

$$B' = \begin{bmatrix}
01011000 & 11001010 & 11110100 \\
00101100 & 01100101 & 01111010 \\
00010110 & 10110010 & 00111101 \\
00001011 & 01011001 & 10011110 \\
10000101 & 10101100 & 01001111 \\
11000010 & 01010110 & 10100111 \\
01100001 & 00101011 & 11010011 \\
10110000 & 10010101 & 11101001 \\
\\
00111100 & 00010110 & 11011100 \\
00011110 & 00001011 & 01101110 \\
00001111 & 10000101 & 00110111 \\
10000111 & 11000010 & 10011011 \\
11000011 & 01100001 & 11001101 \\
11100001 & 10110000 & 11100110 \\
11110000 & 01011000 & 01110011 \\
01111000 & 00101100 & 10111001 \\
\\
00000000 & 00000000 & 10000000 \\
00000000 & 00000000 & 01000000 \\
00000000 & 00000000 & 00100000 \\
00000000 & 00000000 & 00010000 \\
00000000 & 00000000 & 00001000 \\
00000000 & 00000000 & 00000100 \\
00000000 & 00000000 & 00000010 \\
00000000 & 00000000 & 00000001
\end{bmatrix}$$

Fig. 3

$$D = \begin{bmatrix}
10000001 & 00000000 & 00000000 \\
11000000 & 00000000 & 00000000 \\
01100000 & 00000000 & 00000000 \\
00110000 & 00000000 & 00000000 \\
00011000 & 00000000 & 00000000 \\
00001100 & 00000000 & 00000000 \\
00000110 & 00000000 & 00000000 \\
00000011 & 00000000 & 00000000 \\
\\
00000000 & 10000001 & 00000000 \\
00000000 & 11000000 & 00000000 \\
00000000 & 01100000 & 00000000 \\
00000000 & 00110000 & 00000000 \\
00000000 & 00011000 & 00000000 \\
00000000 & 00001100 & 00000000 \\
00000000 & 00000110 & 00000000 \\
00000000 & 00000011 & 00000000 \\
\\
10000000 & 10000000 & 10000000 \\
01000000 & 01000000 & 01000000 \\
00100000 & 00100000 & 00100000 \\
00010000 & 00010000 & 00010000 \\
00001000 & 00001000 & 00001000 \\
00000100 & 00000100 & 00000100 \\
00000010 & 00000010 & 00000010 \\
00000001 & 00000001 & 00000001
\end{bmatrix}$$

Fig. 4

LOW COMPLEXITY LDPC ENCODING ALGORITHM

FIELD

This invention relates to the field of integrated circuit fabrication. More particularly, this invention relates to a method of implementing low-density parity-check (LDPC) codes that allows efficient performance of the encoding steps.

BACKGROUND

Low density parity-check (LDPC) codes were first proposed by Gallager in 1962, and then "rediscovered" by MacKay in 1996. LDPC codes have been shown to achieve an outstanding performance that is very close to the Shannon transmission limit.

LDPC codes are based on a binary parity-check matrix H with n columns and m=n−k rows that has the following properties:

1. Each row consists of $\rho$ number of "ones;"
2. Each column consists of $\gamma$ number of "ones;"
3. The number of "ones" in common between any two columns, denoted as $\lambda$, is no greater than one; and
4. Both $\rho$ and $\gamma$ are small compared to the length of the code and the number of rows in H.

For every given binary source message $u=\{u_0, \ldots, u_{k-1}\}$ of length k, the LDPC encoder builds a binary codeword $v=\{v_0, \ldots, v_{n-1}\}$ of length n where (n>k), such that Hv=0. The codeword consists of two parts. The first k bits of the codeword are equal to the bits of the source message. The other n−k bits of the codeword are the so-called parity-check bits $p=\{p_0, \ldots, p_{n-k-1}\}$. The main task of the encoder is to calculate these parity-check bits p for the given input message u.

To simplify matrix operations, the parity check matrix can be composed of $\rho\gamma$ cells. The cells are arranged in $\rho$ columns and $\gamma$ rows, as given below.

$$H = \begin{pmatrix} H_{0,0} & \ldots & H_{0,\rho-1} \\ \ldots & \ldots & \ldots \\ H_{\gamma-1,0} & \ldots & H_{\gamma-1,\rho-1} \end{pmatrix}$$

Each cell is a t×t permutation matrix (n=$\rho$t, n−k=$\gamma$t). It contains exactly one value of "one" in every row and every column. Therefore, properties (1), (2), and (4) as listed above are satisfied by the construction of the matrix. An example of a cell-based parity-check matrix with k=32, n=56, $\gamma$=3, and $\rho$=7 is depicted in FIG. 2.

Matrix H can be considered as a concatenation of two sub matrices: A and B. Matrix A contains k columns and (n−k) rows. It includes the first k columns of H. Matrix B is a square matrix that contains (n−k) columns and (n−k) rows. It includes the last (n−k) columns of matrix H. The source equation Hv=0 can then be rewritten as Au+Bp=0, or Bp=x, where x=Au. Therefore, the calculation of the parity-check bits can be performed in two steps:

1. Calculate vector x by performing multiplication of the matrix A and the source message u; and
2. Calculate vector p by solving the linear system Bp=x.

All existing LDPC encoder implementations divide the calculation of the parity-check bits into these two steps as explained above.

Matrix A is a so-called "low-density" matrix, in that it contains just a small number of "ones," and so can be efficiently stored in a memory. An especially compact representation of matrix A is achieved if the matrix has the cell-based structure as described above. The simple structure of matrix A allows an efficient implementation of the first step.

The most difficult part of the encoding process is the second step. Different solutions have been proposed to accomplish this step, but the existing solutions either require too much computational effort, work with a very limited and inefficient matrix B, or use different structures for the matrices A and B and, therefore, complicate the decoder structure.

Some methods use a two-diagonal matrix B. In this case, step 2 can be performed very fast, but the simulation results show that this code is relatively weak. The reason for this is that many columns have only two "ones." Another problem with this code is that the decoder must take into account the different structures of A and B. Therefore, the decoder becomes more complicated. In reality, this code does not fully satisfy the four conditions presented above, in that different columns of the parity-check matrix have a different number of "ones." Such codes are generally called irregular LDPC codes.

In other methods, the matrix B is selected to be a non-singular matrix. According to such methods, $B^{-1}$ exists and $p=B^{-1}x$. To find the parity-check bits, the inverse matrix $B^{-1}$ is multiplied by the vector x. The problem with this method is that the matrix $B^{-1}$ is not a low-density matrix anymore. Some significant additional resources are needed to store this matrix and to efficiently perform the multiplication. Another problem with this approach is that we cannot compose the matrix B from permutation sub matrices, because matrices based on permutation cells are always singular. This means that the matrices A and B have different structures, and once again the decoder becomes more complicated.

What is needed, therefore, is a method that overcomes problems such as those described above, at least in part.

SUMMARY

The above and other needs are met by a method according to the present invention of encoding a binary source message u, by calculating x:=Au, calculating y:=B'x, resolving the equation Dp=y for p, and incorporating u and p to produce an encoded binary message v, where A is a matrix formed only of permutation sub matrices, B' is a matrix formed only of circulant permutation sub matrices, and D is a matrix of the form $$D = \begin{pmatrix} T & 0 & \ldots & 0 & 0 \\ 0 & T & \ldots & 0 & 0 \\ \ldots & \ldots & \ldots & \ldots & \ldots \\ 0 & 0 & \ldots & T & 0 \\ I & I & \ldots & I & I \end{pmatrix}$$

where T is a two-diagonal, circulant sub matrix, and I is an identity sub matrix.

According to another aspect of the invention, the entire parity-check matrix is constructed of permutation sub matrices. In prior art methods, only part of the parity-check matrix is constructed of permutation sub matrices. That condition leads to irregularity and complication of the decoding process. From an implementation point of view, it is simpler to support operations with a parity-check matrix that is constructed of permutation cells of a size that is a power of two. Prior art methods cannot be used with this kind of parity-check matrix. The present method supports such matrices without any problems, which tends to simplify the encoding and decoding processes.

The current method also supports a more variable structure for the parity-check matrix: sub matrix B doesn't have to be a non-singular matrix. By way of explanation, if sub matrix B is non-singular, then the parity-check matrix cannot have an even weight (or in other words, the number of ones in a column must be odd). This is a big disadvantage. For example, sometimes a weight of four is sufficient to achieve good error-correcting properties, but a weight of three is not enough. Prior art methods are then forced to use a matrix with a weight of five or more (or use irregular LDPC codes instead). This causes a complication during encoding and decoding (more resources are required to process the matrix as the number of ones increases). However, the present method supports matrices with an even weight.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 2 depicts a circulant permutation matrix H according to an embodiment of the present invention.

FIG. 3 depicts a circulant-cell-based matrix B' according to an embodiment of the present invention.

FIG. 4 depicts a fixed-format matrix D according to an embodiment of the present invention

DETAILED DESCRIPTION

Figure 1:
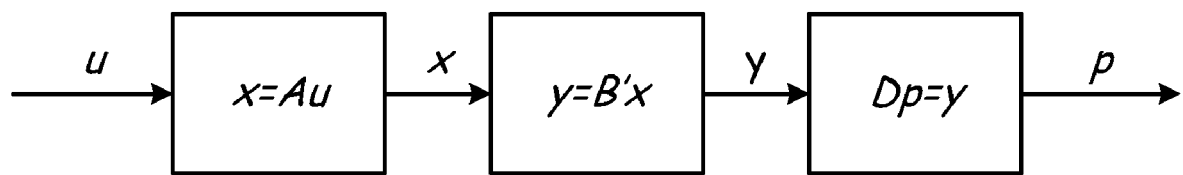
FIG. 1 is a flow chart for an LDPC encoding algorithm according to an embodiment of the present invention.

The present invention provides a method for encoding low-density parity-check (LDPC) codes, and defines a subclass of LDPC codes that is appropriate for this method. The method uses a parity-check matrix based on permutation sub matrices. The matrix has a regular structure that allows simplification of the corresponding encoder and decoder circuits. The method uses uniform cell-based parity check matrices (both A and B have the same cell-based structure) and allows an efficient computation of the encoding steps. One embodiment of a method according to the present invention is present below.

DESCRIPTION OF THE TARGET CLASS OF CODES

Circulant matrix $M_c$ is a square t×t matrix, where the $i^{th}$ row (where $0<i<t$) is a cyclical shift of the first row (called the $0^{th}$ row) by i positions to the right, given as:

$$M_C = \begin{pmatrix} a_0 & a_1 & \cdots & a_{t-1} \\ a_{t-1} & a_0 & \cdots & a_{t-2} \\ \cdots & \cdots & \cdots & \cdots \\ a_1 & a_2 & \cdots & a_0 \end{pmatrix}$$

It follows from the definition above that the circulant matrix is completely determined by its first row. Let's represent the circulant matrix as a polynomial expression $P_c$ that has coefficients equal to the matrix coefficients from the first row:

$$P_c = a_0 + a_1 x + a_2 x^2 + \ldots + a_{t-1} x^{t-1}$$

The addition and multiplication of circulant matrices is thus equivalent to the addition and multiplication of the polynomials in a ring of polynomials with a maximum degree of t−1.

A circulant permutation matrix is a special case of a circulant matrix. The first line of a circulant permutation matrix contains the value "one" in the $i^{th}$ position. The $j^{th}$ line contains a "one" in the $(i+j)(\bmod t)^{th}$ position. Therefore the $j^{th}$ line is a cyclical shift of the $(j-1)^{th}$ line. The corresponding polynomial for a circulant permutation matrix contains exactly one non-zero coefficient.

Let's consider a square m×m matrix $M_p$ of polynomials of degree t−1:

$$M_p = \begin{pmatrix} p_{0,0} & \cdots & p_{0,m-1} \\ \cdots & \cdots & \cdots \\ p_{m-1,0} & \cdots & p_{m-1,m-1} \end{pmatrix}$$

$M_p$ is defined to be regularizable if such a matrix $M'_p$ exists such that $M'_p M_p = G_p$, where $G_p$ has a special fixed format of:

$$G_p = \begin{pmatrix} x^{t-1}+1 & 0 & \cdots & 0 & 0 \\ 0 & x^{t-1}+1 & \cdots & 0 & 0 \\ \cdots & \cdots & \cdots & \cdots & \cdots \\ 0 & 0 & \cdots & x^{t-1}+1 & 0 \\ 1 & 1 & \cdots & 1 & 1 \end{pmatrix}$$

Let's now take a cell-based matrix $M_0$, where each cell is a circulant sub matrix. $M_0$ is regularizable if the corresponding matrix based on the polynomials is regularizable. Thus, if $M_0$ is regularizable, then such a matrix $M'_0$ exists such that $M'_0 M_0 = D$, where $M'_0$ is a cell-based matrix with circulant cells and D has a special fixed format of:

$$D = \begin{pmatrix} T & 0 & \cdots & 0 & 0 \\ 0 & T & \cdots & 0 & 0 \\ \cdots & \cdots & \cdots & \cdots & \cdots \\ 0 & 0 & \cdots & T & 0 \\ I & I & \cdots & I & I \end{pmatrix}$$

where $T = \begin{pmatrix} 1 & 0 & 0 & \cdots & 0 & 1 \\ 1 & 1 & 0 & \cdots & 0 & 0 \\ 0 & 1 & 1 & \cdots & 0 & 0 \\ \cdots & \cdots & \cdots & \cdots & \cdots & \cdots \\ 0 & 0 & 0 & \cdots & 1 & 0 \\ 0 & 0 & 0 & \cdots & 1 & 1 \end{pmatrix}$ − 2-diagonal circulant, $I = \begin{pmatrix} 1 & 0 & 0 & \cdots & 0 & 0 \\ 0 & 1 & 0 & \cdots & 0 & 0 \\ 0 & 0 & 1 & \cdots & 0 & 0 \\ \cdots & \cdots & \cdots & \cdots & \cdots & \cdots \\ 0 & 0 & 0 & \cdots & 1 & 0 \\ 0 & 0 & 0 & \cdots & 0 & 1 \end{pmatrix}$ − identity matrix.

An example of matrix D is given in FIG. 4.

Now we are ready to define the target subclass of LDPC codes according to this embodiment of the present invention. We consider the parity-check matrix H, based on permutation square cells, as given below:

$$H = \begin{pmatrix} H_{0,0} & \ldots & H_{0,\rho-1} \\ \ldots & \ldots & \ldots \\ H_{\gamma-1,0} & \ldots & H_{\gamma-1,\rho-1} \end{pmatrix}$$

Every square block $H_{i,j}$ is a permutation matrix. An example of this is depicted in FIG. 2. Matrix H is represented as a concatenation of two matrices: H=[A|B], where B is an (n−k)×(n−k) square matrix, and A is an (n−k)×n matrix, as depicted in FIG. 2.

Matrix A can be composed of different types of permutation sub matrices. One possible sub matrix type is a circulant permutation sub matrix. Another possible type is a so-called bitwise permutation matrix. These matrices are based on bitwise exclusive OR operations. The first line of a bitwise permutation matrix contains a value of "one" in the $i^{th}$ position. The $j^{th}$ line contains a value of "one" in the $(i \oplus j)^{th}$ position. It is also possible to use other types of permutation sub matrices.

Matrix B is a regularizable cell-based matrix that is composed of circulant permutation sub matrices only. If $H_0$ is an arbitrary circulant permutation-cell-based parity-check matrix that is not specially designed to have a regularizable sub matrix B, then it is almost always possible to rearrange the columns of $H_0$ in such a way that it will have the required structure. Therefore, almost every circulant permutation-cell-based parity-check matrix can be converted into the target format according to the present invention.

Encoding Method for the Described Class of Codes

For a given binary source message u={$u_0, \ldots, u_{k-1}$} of length k, the LDPC encoder builds a binary codeword v={$v_0, \ldots, v_{n-1}$} of length n where (n>k), such that Hv=0. The last equation can be rewritten as Au+Bp=0, or Bp=x, where x=Au. Note that B is singular, so $B^{-1}$ doesn't exist. B is regularizable, so a circulant-cell-based matrix B' exists such that B'B=D (as depicted in FIG. 3). Therefore, the equation Bp=x can be rewritten as Dp=B'x.

The encoder stores matrices A and B'. Matrix A (an example of which is depicted in FIG. 2) is composed from $\gamma(\rho-\gamma)$ permutation sub matrices, so only $\gamma(\rho-\gamma)(\log t+1)$ bits are required to store matrix A (if two different types of permutation sub matrices are used). Matrix B' (an example of which is depicted in FIG. 3) is composed of $\gamma^2$ circulant sub matrices, so only $\gamma^2 t=\gamma(n-k)$ bits are required to store matrix B'.

The encoding algorithm consists of three steps, as depicted in FIG. 1:

1. Calculate x: =Au;
2. Calculate y: =B'x; and
3. Resolve the equation Dp=y.

The first and the second steps can be efficiently implemented because of the cell-based structure of the matrices A and B'. The last step is especially fast and computationally simple, because of the fixed, simple structure of the matrix D. On the last step, the parity-check bits can be computed using the formulas below:

$$p_{jt+k} = \sum_{i=0}^{k} y_{jt+i}, \text{ where } k = 0, \ldots t-1, j = 0, \ldots, \gamma-2$$

$$p_{(\gamma-1)t+k} = y_{(\gamma-1)t+k} + \sum_{i=0}^{\gamma-2} p_{it+k}, \text{ where } k = 0, \ldots t-1$$

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of encoding a binary source message u, the method comprising the steps of:
    1. calculating x:=Au,
    2. calculating y=B'x,
    3. resolving the equation Dp=y for p, and
    4. incorporating u and p to produce an encoded binary message v, where
    A is a matrix formed only of permutation sub matrices,
    B' is a matrix formed only of circulant permutation sub matrices, and
    D is a matrix of the form $$D = \begin{pmatrix} T & 0 & \ldots & 0 & 0 \\ 0 & T & \ldots & 0 & 0 \\ \ldots & \ldots & \ldots & \ldots & \ldots \\ 0 & 0 & \ldots & T & 0 \\ I & I & \ldots & I & I \end{pmatrix}$$

where
    T is a two-diagonal, circulant sub matrix, and
    I is an identity sub matrix.

2. The method of claim 1, wherein B'Bz=Dz for any z and B is a singular matrix.

3. In an LDPC encoder, the improvement comprising implementing the method of claim 1, wherein the encoder stores matrices A and B' in a memory.

* * * * *